US009575135B2

(12) United States Patent
van Lammeren et al.

(10) Patent No.: US 9,575,135 B2
(45) Date of Patent: Feb. 21, 2017

(54) BATTERY MONITORING CIRCUIT, APPARATUS AND METHOD (75) Inventors: Johannes Petrus Maria van Lammeren, Beuningen (NL); Matheus Johannes Gerardus Lammers, Nederweert (NL)

(73) Assignee: DATANG NXP SEMICONDUCTORS CO., LTD., Jiangsu (CN)

( * ) Notice: Subject to any disclaimer, the term of this patent is extended or adjusted under 35 U.S.C. 154(b) by 494 days.

(21) Appl. No.: 13/150,959

(22) Filed: Jun. 1, 2011

(65) Prior Publication Data
US 2012/0310562 A1 Dec. 6, 2012

(51) Int. Cl.
*G01R 31/36* (2006.01)

(52) U.S. Cl.
CPC ....... *G01R 31/3662* (2013.01); *G01R 31/3606* (2013.01); *G01R 31/3651* (2013.01); *G01R 31/3658* (2013.01); *G01R 31/36* (2013.01); *G01R 31/3648* (2013.01)

(58) Field of Classification Search
CPC . G01R 31/36; G01R 31/3606; G01R 31/3648; G01R 31/3651; G01R 31/3658; G01R 31/3662
USPC ......................................................... 702/63
See application file for complete search history.

(56) References Cited

U.S. PATENT DOCUMENTS

| 4,258,306 | A | * | 3/1981 | Bourke et al. | 320/134 |
| 5,656,915 | A | * | 8/1997 | Eaves | 320/118 |
| 5,705,929 | A | * | 1/1998 | Caravello et al. | 324/430 |
| 6,160,382 | A | * | 12/2000 | Yoon et al. | 320/136 |
| 6,556,020 | B1 | * | 4/2003 | McCabe et al. | 324/426 |
| 7,081,737 | B2 | * | 7/2006 | Liu | H01M 10/441 320/130 |
| 7,474,228 | B2 | * | 1/2009 | Lockhart et al. | 340/636.1 |
| 7,847,557 | B2 | * | 12/2010 | Yun et al. | 324/430 |
| 8,093,862 | B2 | * | 1/2012 | Mariels | 320/116 |
| 8,264,201 | B2 | * | 9/2012 | Tae et al. | 320/118 |

(Continued)

FOREIGN PATENT DOCUMENTS

WO  2010/083291 A1  7/2010

OTHER PUBLICATIONS

Blanchard, et al., "Elecrochemical impedance spectroscopy of small Ni—Cd sealed batteries: application to state of charge determinations", J. Appl. Electrochem. 22 (1992) 1121-1128.*

*Primary Examiner* — Sujoy Kundu
*Assistant Examiner* — Lynda Dinh
(74) *Attorney, Agent, or Firm* — Paul M. H. Pua; Foley & Lardner LLP (57) ABSTRACT

Various aspects of the present disclosure are directed to monitoring battery cells. In accordance with various embodiments, a battery pack having a plurality of battery cells connected in series is monitored. Current is separately injected into individual ones of the plurality of battery cells, such as by operating a balancing circuit coupled across an individual cell, to inject current (e.g., positive or negative) into the cell. For each of the battery cells, an output is provided to indicate cell voltage of the battery cell responsive to the current injected therein. An output indicative of current through each of the battery cells is provided as well. From the respective outputs as corresponding to each individual cell, amplitude and phase characteristics of the current and voltage outputs for each of the cells are extracted to provide an indication of an impedance characteristic of the cell(s).

19 Claims, 4 Drawing Sheets

(56) References Cited

U.S. PATENT DOCUMENTS

| | | | |
|---|---|---|---|
| 8,288,992 B2* | 10/2012 | Kramer et al. | 320/119 |
| 8,352,204 B2* | 1/2013 | Morrison et al. | 702/75 |
| 8,378,687 B2* | 2/2013 | Yoneda et al. | 324/430 |
| 8,384,360 B2* | 2/2013 | Cegnar et al. | 320/166 |
| 8,447,544 B2* | 5/2013 | Hsu et al. | 702/63 |
| 2006/0170397 A1* | 8/2006 | Srinivasan et al. | 320/132 |
| 2007/0257681 A1* | 11/2007 | Christophersen et al. | 324/426 |
| 2008/0180059 A1* | 7/2008 | Carrier et al. | 320/112 |
| 2008/0303484 A1* | 12/2008 | Lee et al. | 320/134 |
| 2009/0096421 A1* | 4/2009 | Seman, Jr. | 320/122 |
| 2009/0096459 A1* | 4/2009 | Yoneda et al. | 324/430 |
| 2010/0052614 A1* | 3/2010 | Mariels | 320/116 |
| 2010/0213900 A1* | 8/2010 | Carrier et al. | 320/134 |
| 2010/0256936 A1* | 10/2010 | Darilek et al. | 702/63 |
| 2011/0086256 A1* | 4/2011 | Julstrom et al. | 429/121 |
| 2011/0241623 A1* | 10/2011 | Wade et al. | 320/119 |
| 2011/0248681 A1* | 10/2011 | Miller et al. | 320/126 |
| 2011/0298626 A1* | 12/2011 | Fechalos et al. | 340/664 |
| 2012/0038323 A1* | 2/2012 | Densham et al. | 320/137 |
| 2012/0049802 A1* | 3/2012 | Barsukov et al. | 320/136 |
| 2012/0056584 A1* | 3/2012 | Mariels | 320/109 |
| 2012/0203483 A1* | 8/2012 | Ghantous et al. | 702/63 |

* cited by examiner

BATTERY MONITORING CIRCUIT, APPARATUS AND METHOD

BACKGROUND

In many rechargeable battery applications, such as used in battery systems for hybrid/electric vehicles, large numbers of series-connected batteries are used to generate a high voltage that can be used to drive components such as an automotive motor. In such systems, it is important to understand the SoH (State of Health) and the SoC (State of Charge) of the series-connected batteries (e.g., a battery pack).

SUMMARY

One manner in which to estimate or determine the SoH and/or SoC involves using the impedance of the battery cell(s), in which the impedance of the cell(s) (and the way it changes over time) can be used to accurately determine these characteristics. While the SoC is not generally derived directly from the impedance, but knowledge of the SoH can help to improve SoC estimation, particularly as the cells get older and have gone through more charge/discharge cycles. Understanding the SoH and/or SoC also makes it possible to apply desirable/optimum charge and discharge strategies that can maximize the calendar life, cycle life and energy storage capacity of the battery pack.

Accordingly, it is useful to determine the condition of a battery cell in an accurate and reliable manner, for use in a variety of cell monitoring and control applications. For example, such information can be useful in controlling the charge of the cells and in providing an indication of an overall charge level of the battery.

However, detecting battery cell characteristics can be challenging. For example, battery cell voltage and current can be measured simultaneously to estimate impedance, but this measurement can be challenging. In addition, such approaches may produce results that fail to accurately represent the battery cell impedance. Moreover, many cell condition detection approaches may require the communication and processing of a significant amount of data, which can be challenging to implement for various systems.

These and other matters continue to present challenges to the monitoring of battery cell characteristics.

Various example embodiments are directed to monitoring characteristics of a battery, such as a battery pack used in electric vehicles.

According to an example embodiment, an energy storage cell apparatus includes a plurality of battery cells, a current injection circuit, an impedance-detection circuit and a data extraction circuit coupled to the impedance-detection circuit. The current injection circuit separately injects current into individual ones of the plurality of battery cells, and the impedance-detection circuit detects an impedance characteristic of the plurality of battery cells in response to the injected current therein. The data extraction circuit receives impedance data regarding the detected impedance characteristic from the impedance-detection circuit, separates low-frequency components of the impedance data from high-bandwidth (e.g., including high frequencies) components of the impedance data, and extracts impedance information for the plurality of battery cells from the high-bandwidth components. The apparatus further includes an output circuit that provides the low-frequency components and the extracted impedance information from the high-bandwidth components as an output indicative of impedance characteristics of the energy storage cell apparatus.

Another example embodiment is directed to a monitoring circuit for monitoring a battery pack having a plurality of battery cells connected in series. The monitoring circuit includes a current injection circuit that separately injects current into individual ones of the plurality of battery cells, and a voltage detection circuit that provides an output indicative of cell voltage of the battery cell, responsive to the injected current for each of the battery cells. The circuit further includes a current detection circuit that provides an output indicative of voltage on a resistor circuit that is connected in series with the battery cells and therein indicates current through the battery cells. An extraction circuit extracts amplitude and phase characteristics of the outputs of the current and voltage detection circuits, to provide an output indicative of the extracted amplitude and phase and an impedance characteristic of the cells that is responsive to the injected current.

Another example embodiment is directed to monitoring a battery pack having a plurality of battery cells connected in series, in a battery pack circuit (e.g., in a control circuit). Current is separately injected into individual ones of the plurality of battery cells. For each of the battery cells, an output indicative of cell voltage of the battery cell is provided in response to the current injected into the battery cell, and an output indicative of current through each of the battery cells is also provided. Amplitude and phase characteristics of the current and voltage outputs are extracted for each of the cells, to provide an indication of an impedance characteristic of the cells.

The above discussion/overview is not intended to describe each embodiment or every implementation of the present disclosure. The figures and detailed description that follow also exemplify various embodiments.

BRIEF DESCRIPTION OF THE DRAWINGS

Various example embodiments may be more completely understood in consideration of the following detailed description in connection with the accompanying drawings, in which.

DETAILED DESCRIPTION

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims. In addition, the term "example" as used throughout this application is only by way of illustration, and not limitation.

Aspects of the present invention are believed to be applicable to a variety of different types of devices, systems and arrangements involving batteries and/or battery control, including those involving automotive applications. While the present invention is not necessarily so limited, various aspects of the invention may be appreciated through a discussion of examples using this context.

In one or more embodiments, impedance characteristics are detected for battery cells in a battery pack having a plurality of such cells. Current through the cells (e.g., as coupled in series) and voltages of individual cells are detected and used to provide the impedance characteristic. Detected components of the battery cells are processed according to frequency characteristics thereof, to reduce the amount of data communicated for characterizing impedance. In some implementations, high-bandwidth components of detected battery cell parameters are preprocessed and communicated for determining impedance characteristics of individual cells in a battery pack.

Various embodiments are directed to monitoring cell performance under different types of conditions. The cell impedance is monitored during the life of the cell, with different values of the parameters used to obtain useful information regarding the properties of the cell. This multi-dimensional information can be recorded and used to provide information upon which battery characteristics can be determined. This approach may facilitate, for example, the detection/determination of impedance curves corresponding to one or more of many parameters such as cell chemistry, cell temperature, DC cell current, state of charge (SoC), cell cycle life, and cell calendar age.

In various implementations, battery electrical characteristics are separated by frequency and used/processed for communication as follows. Low frequencies (e.g., up to ~4 Hz) are used to determine both the SoC and a low-frequency part of an impedance curve for a battery cell/cells. Higher frequencies (e.g., above ~4 Hz) are used to determine a high-frequency portion of an impedance curve of the battery cell/cells. The data rate for data to be communicated (e.g., to a central system via an automotive data bus) is reduced by separating low frequency portions, communicating the low frequency data, pre-processing the high-bandwidth (including high frequency) data to extract data upon which battery impedance characteristics can be determined, and communicating the extracted data (e.g., compressed, if appropriate). In certain embodiments, the low frequency portion is also pre-processed before communication to an external device (e.g., battery controller).

For general information regarding impedance-based determination of battery characteristics, and for specific information regarding such approaches as may be implemented in accordance with one or more example embodiments, reference may be made to U.S. Patent Publication 2005/218915A1, to F Huet, "A review of impedance measurements for determination of State-of-Charge and State-of-Health of secondary batteries", J. Power Sources, Vol. 70, No. 1, 59-69 (January 1998), and to J L. Jespersen et al., "Capacity measurement of Li-Ion batteries using AC impedance spectroscopy", World Electric Vehicle Journal Vol. 3, all of which are fully incorporated herein by reference.

In another example embodiment an energy storage cell includes a plurality of battery cells, a current injection circuit, an impedance-detection circuit and a data extraction circuit that is coupled to the impedance-detection circuit. The current injection circuit injects current into individual ones of the plurality of battery cells, separately from other cells, such as by selectively coupling (e.g., cyclically) a cell balance or other type of circuit across each cell. The impedance-detection circuit detects an impedance characteristic of the plurality of battery cells in response to the injected current therein. For example, by detecting voltage across the cell in response to the injected current, under one or more conditions, an output of such voltage through a particular battery cell (together with detected and/or known current through the battery cell) can be used to indicate impedance characteristics of the cell and, accordingly, a health-type condition of the cell.

The data extraction circuit receives impedance data regarding the detected impedance characteristic from the impedance-detection circuit, and separates low-frequency components of the impedance data. The low frequency components can be processed internally, or sent to an external circuit for evaluation (e.g., and use for SoC estimation and cell balancing operations). The high-bandwidth components are processed locally at the extraction circuit, to extract impedance information for the plurality of battery cells. An output circuit provides the low-frequency components and the extracted impedance information from the high-bandwidth components as an output indicative of impedance characteristics of the energy storage cell apparatus.

In some embodiments, a subset of the battery cells is selected for evaluation based upon a state of charge characteristic of the subset, and therein used to identify cells to be monitored. For example, if operational characteristics of a subset of battery cells are detected as being out of a particular range, each cell in the subset can be evaluated as discussed herein. This approach can be used, for example, to facilitate the evaluation of a battery pack without necessarily evaluating all cells. In one implementation, for each battery cell in the subset, a cell balancing circuit is coupled across the battery cell to inject current in the battery cell, separately from current injected into other battery cells in the subset.

In various implementations, the data extraction circuit is integrated on a common circuit with the impedance-detection circuit. The data extraction circuit includes a voltage transform circuit configured to extract voltage amplitude and phase information from the high-bandwidth (including high-frequency) components of an output of the voltage detection circuit, and a current transform circuit configured to extract current amplitude and phase information from the high-bandwidth components of an output of the current detection circuit.

The separate injection of current can be effected on an intermittent or cyclic basis to control the amount of current injected into each cell. In some embodiments, a current injection circuit as discussed herein separately injects current into individual ones of the plurality of battery cells by, for each battery cell, operating a switch using a modulated signal to selectively couple and decouple a balancing circuit (or other current supply) to the battery cell. The current is injected at a duty cycle that limits the amount of current injected into the battery cell. The impedance-detection circuit detects an impedance characteristic of each battery cell based upon the modulated signal. Such injection can be carried out at a frequency that effects an injection of a predefined current into the battery cell for impedance measurement. Manners in which current may be injected include, for example, coupling a resistor circuit across the battery cell to passively bleed current from the battery cell, or coupling an inductor circuit across the battery cell to actively induce current via the battery cell.

As discussed above, various embodiments are directed to using cell balancing circuits to inject current into battery cells for impedance measurement. Such embodiments may, for example, be implemented using one or both of resistive and inductive balancing systems. Further, the various embodiments described herein as implementable with resistive systems may be implemented with other systems, such as inductive systems (e.g., using an inductive balancer that maintains bias current at nearly zero, instead of a resistive balancer that modulates the signal on a bias current).

In various implementations, balancing circuits are used to drive current through individual cells in a battery pack, with voltage/current levels held low to facilitate modelling of the battery as a linear system. The current is converted into a voltage by a resistor connected in series with the battery. Band-pass filters are used to eliminate unwanted signals (e.g., noise and distortion) before they can reach amplitude-and-phase meters, which measure the battery voltage and the voltage across the conversion resistor. Generally, the meters and band-pass filters are matching (e.g., identical) to ensure matching gain and delay time in these circuits. Real and imaginary parts of the battery's impedance (Z) are determined from the amplitude and phase of the measured voltages, as follows.

$$|Z_{bat}| = \frac{V_{bat}}{V_{conv}} R_{conv}$$

$$\mathrm{Re}_{bat} = |Z_{bat}| \cdot \cos(\varphi_{bat})$$

$$\mathrm{Im}_{bat} = |Z_{bat}| \cdot \sin(\varphi_{bat})$$

In the equations above, the phase of the voltage across $R_{conv}$ is defined as zero.

The voltage/current source can be either under the control of a measurement system (e.g., a sine wave generator), or outside direct control of a system performing measurement (e.g., via the drive current of a traction motor of an electric car employing the battery pack). When implemented with an automobile, measurement system control can be implemented when the car is at rest, and the drive current control approach can be used when the automobile is moving. With measurement system control, battery impedance can be measured at any desired frequency at any time. Further, certain band-pass filters can be omitted in applications in which the environment in which the measurement takes place is a low noise/distortion type of environment.

Figure 1:
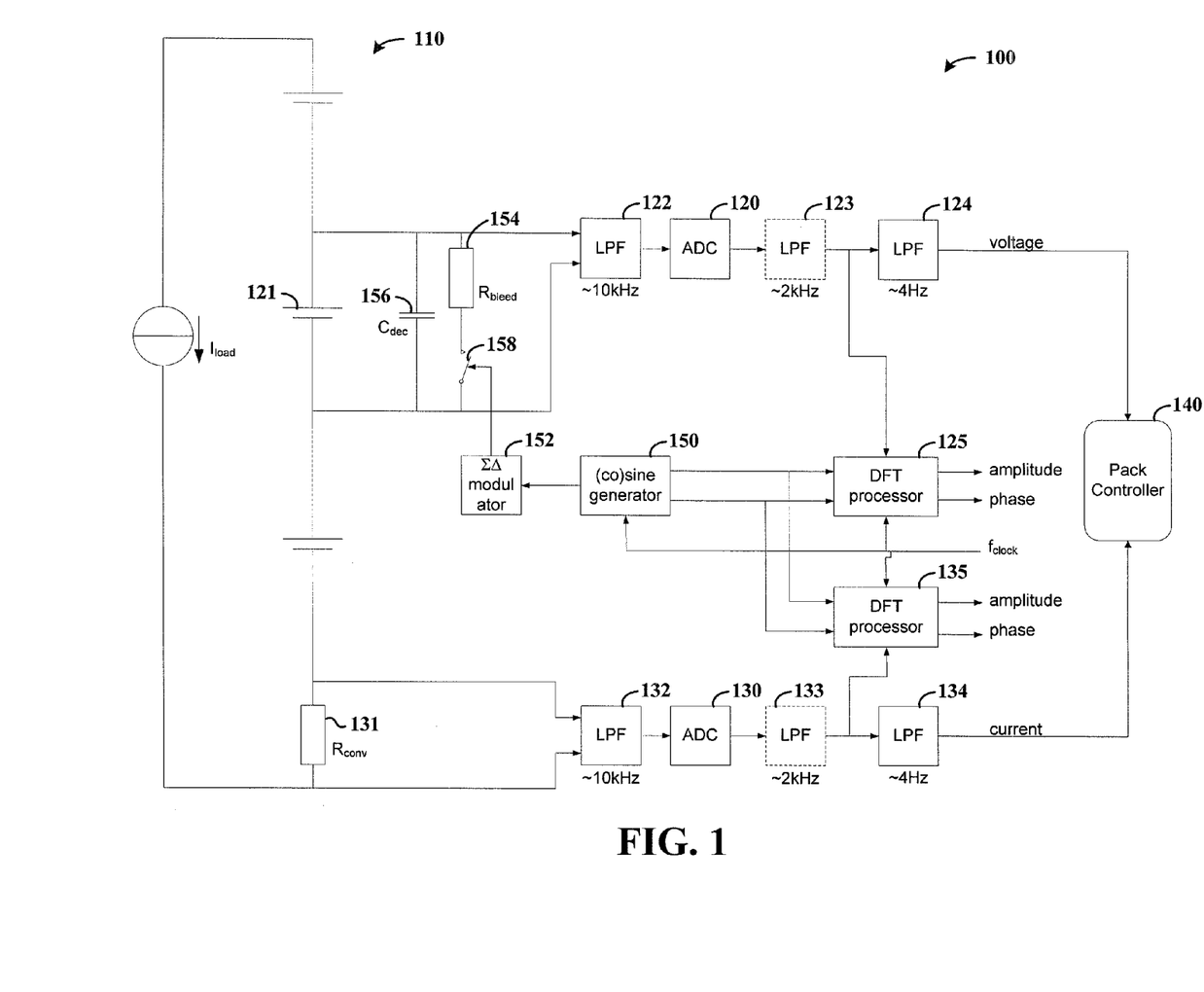
FIG. 1 shows a system for measuring cell characteristics of a battery pack, in accordance with an example embodiment of the present invention.

Turning now to the figures, FIG. 1 shows a system 100 that measures (e.g., detects) the cell impedance of a battery pack 110, in accordance with another example embodiment. The impedance can be measured, for example, when the battery pack is at rest and/or when the battery pack is being charged or discharged. An analogue-to-digital converter (ADC) 120 measures cell voltage at 121, and ADC 130 measures voltage on a resistor 131 that converts the pack current into a voltage, respectively providing cell voltage and pack current for use in characterizing an impedance characteristic of the cell being measured. Such components can be generally used to characterize impedance for a variety of cells in this manner.

Anti-alias filters 122 and 132 (e.g., about 10 kHz) respectively filter the voltage (signal) as provided at inputs of the ADCs 120 and 130. The output of ADC 120 is coupled to series-connected low-pass filters 123 and 124, and the output of ADC 130 is similarly coupled to series-connected low-pass filters 133 and 134. For each of the series-connected low pass filters, the first filter has a far higher cut-off frequency than the second (e.g., about 2 kHz and 4 Hz, respectively). The outputs of the first low pass filters 123 and 133 are respectively fed to discrete Fourier transform (DFT) processors 125 and 135, which detect the amplitude and phase of the measurement frequency/frequencies presented via the ADCs 120 and 130.

The outputs of the second low-pass filters 124 and 134 are both fed to a pack controller 140, for use in SoC estimation. In some implementations, the pack controller 140 further measures/detects cell impedance at low frequencies using the outputs of the second low-pass filters 124 and 134. In such implementations, the impedance is calculated by taking the amplitude and phase of the voltage- and current measurements and dividing them. The pack controller 140 is implemented as part of the system 100, or separately in which system 100 provides an output for use by the pack controller.

The system 100 further includes a (co)sine generator 150 and sigma-delta modulator 152 that inject a current into an individual cell (e.g., at 121) by switching a balancer with a bleed resistor 154 and capacitor 156 on/off with a switch 158 using a modulated signal, such as a pulse-density modulation (PDM) modulated signal. The signal is modulated to apply a desired signal frequency.

A variety of cosine generators can be implemented in connection with these and other embodiments. For general information regarding such generators, and for specific information regarding DFT generators that may be implemented in connection with these embodiments, reference may be to U.S. patent application Ser. No. 13/100,652, entitled "Method to measure the impedances of battery cells in a (H)EV application", and filed on May 4, 2011, which is fully incorporated herein by reference.

Values of the components that generate the current through the cells in the system 100 are used as inputs regarding the current, without necessarily using a current meter in the path of the balance current. With this knowledge, and the voltage of the battery cell for which impedance is to be measured, the value of the current that the modulated balancer injects into the cell is calculated.

In some embodiments, one or both of the low-pass filters 123 and 133 are omitted, with the outputs of the ADCs 120 and 130 respectively connected directly to the second low-pass filters 124 and 134 and to DFT processors 125 and 135 for passing a bitstream directly thereto. In such implementations, one or both of the ADCs shown as connected to the (now-omitted) low-pass filter(s) is implemented as a sigma-delta converter. In certain implementations, the sigma-delta converter generates a single-bit bitstream, and the DFT processors 125 and 135 use full-adder circuits (e.g., in place of multipliers) to simplify the circuits (e.g., the bit indicates add or subtract).

In some implementations, the (co)sine wave generator 150 drives the battery cell 121 using one frequency at a time, with the DFT processors 125/135 being implementable as modulated circuits. In other implementations, the (co)sine wave generator 150 drives the battery cell 121 using a signal with more than one frequency, which facilitates fast measurement of signals (e.g., relative to the repeating of measurements at each frequency of interest).

In some embodiments, the ADCs are implemented using oversampling sigma-delta converters, and which operate at low power with high linearity for measuring low frequencies. The oversampling sigma-delta converter facilitates the use of an anti-alias filter that is smaller than that used in systems with a Nyquist-rate ADC, exhibits the aforesaid low power/high linearity characteristics, and further facilitates integration with other circuitry via its size.

The modulation applied as shown in FIG. 1 or as otherwise described herein may involve executing/following an algorithm for measuring/determining impedance via voltage and . . . current measurements at various frequencies in the range of mHz to kHz. For one or both of resistive and inductive modulation, various embodiments are directed to effecting this modulation by driving a switch (e.g., switch 158 in FIG. 1) with a signal modulated via PWM (Pulse Width Modulation), PDM (Pulse Density Modulation) or both. Furthermore, the frequency and amplitude of the pulses can be tailored to suit the particular battery pack operation, to achieve a signal that is sufficient for evaluating the battery cells yet mitigate power loss. For instance, PDM can be used in fully digital systems with a clock frequency that is designed to be as low as possible to keep dissipation low, via acting on the active clock edges. In such applications, a decoupling capacitor can be used to generate a smooth sine wave.

In some embodiments, the current injected into battery cells via a balancer circuit is injected at a value that is higher than a balancing current that the balancer circuit uses, to ensure accuracy in impedance measurement. In such embodiments, the value of an external resistor used in balancing is set lower than such a resistor used for balancing. To reduce the effective balancing current, a switch is arranged in series with the resistor and driven with a relatively high frequency (e.g., ~100 kHz square wave with a fixed duty cycle) to limit the average balancing current through the resistor, and keep the dissipation and hence the temperature of the resistor within operable (e.g., safe) limits.

Impedance measurement as discussed herein may be carried out in different manners to suit particular applications. In some embodiments, and referring again to FIG. 1, impedance data for frequencies of 4 Hz (sampled at 10 S/s) and lower are analyzed on a main CPU to which the system 100 provides an output, and components of impedance data including frequencies higher than 4 Hz are processed in the integrated DFT processor 125/135. Frequencies lower than 4 Hz are processed either in the integrated DFT processor 125/135, or on a controller for the battery pack.

In some embodiments, one or both of the DFTs 125/135 pre-process signals to reduce the amount of data communicated to a CPU. In some implementations, the impedance is measured and provided at about ten frequencies to facilitate the determination of a complete curve (e.g., for a frequency range of 10 mHz (millihertz) to 2 kHz).

Various changes or modifications may be made with the system 100 to suit applications. For example, the analogue and digital filters in the current and voltage measurement paths of the system 100 can be made to match (e.g., are substantially identical), to facilitate matching/accurate outputs. As another example, the system 100 may be expanded to include circuitry for injecting current to and monitoring of a multitude of battery cells in a battery pack (e.g., a section of the battery pack). In these contexts, a battery section may refer to a group of battery cells that share cell-balancing and measurement components (e.g., at 5-17V, depending on the number of cells in the section, the cell chemistry, SoC, and temperature). A module is a group of such battery sections with a combined voltage (e.g., up to 60V), and a slice is a group of series-connected modules that generate the same voltage as the total battery pack (e.g., 100 V to 600V). Battery packs may include a single slice, or a group of parallel-connected slices in which the parallel connection increases the energy content and power capabilities of the battery pack, but not the voltage. Current can be driven through each battery cell individually, thus mitigating power draw as may be relevant to passing current through an entire battery pack. For example, as shown by dashed lines connecting cells (see, e.g., 121), a multitude of such components may be included in a battery pack and monitored accordingly. In certain embodiments, the same hardware is used to measure the impedance of several cells, such as by selectively connecting the various components as shown in FIG. 1 (e.g., the ADC/filter circuits, DFT processors and (co)sine generator/modulator circuits). Moreover, in such applications, current generator and voltage measurement circuits can be implemented in a common IC, to facilitate synchronization.

Figure 2:
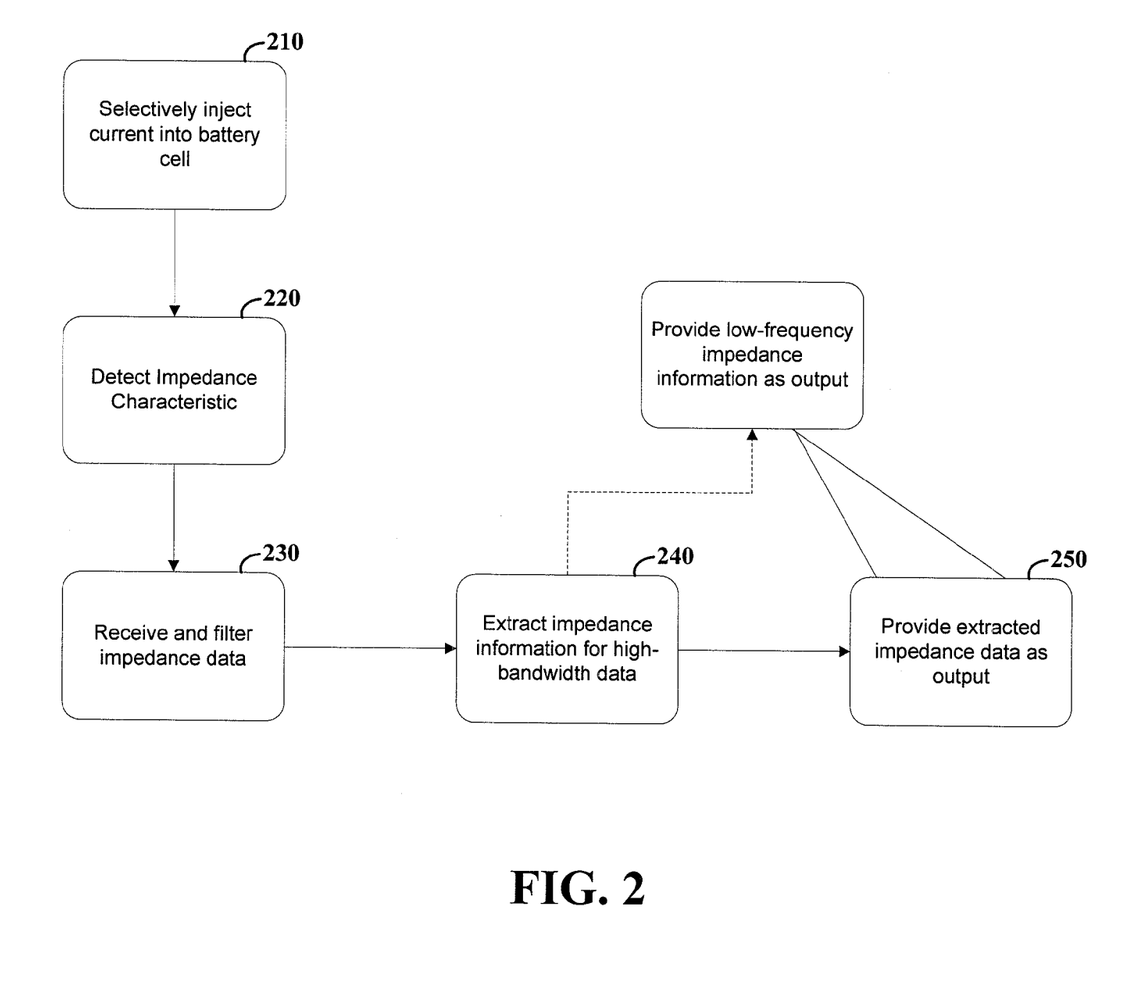
FIG. 2 shows a flow diagram for measuring cell characteristics of a battery pack, in accordance with one or more example embodiments of the present invention.

FIG. 2 shows a flow diagram for measuring cell impedance of a one or more of a plurality of cells in a battery pack, in accordance with another example embodiment. The following discussion pertains to the measurement of a single cell, but may be implemented with additional cells in the battery pack.

At block 210, current is selectively (e.g., cyclically) injected into individual ones of the plurality of battery cells. An impedance characteristic of the battery cell is detected at block 220, in response to the injected current therein. This impedance characteristic detection may, for example, involve detecting a voltage across the cell, and may also include detecting a voltage across a resistor in series with the cell to provide a voltage-based indication of current through the cell.

At block 230, impedance data (e.g., a digital representation of the detected voltage(s)) regarding the detected impedance characteristic is received and filtered to separate low-frequency components thereof. Impedance information for the plurality of battery cells is extracted from the high-bandwidth components at block 240. At block 250, the extracted impedance information from the high-bandwidth components is provided as an output indicative of impedance characteristics of the energy storage cell apparatus. The low-frequency components are also provided, either for processing at block 250 or after extraction at block 240.

Figure 3:
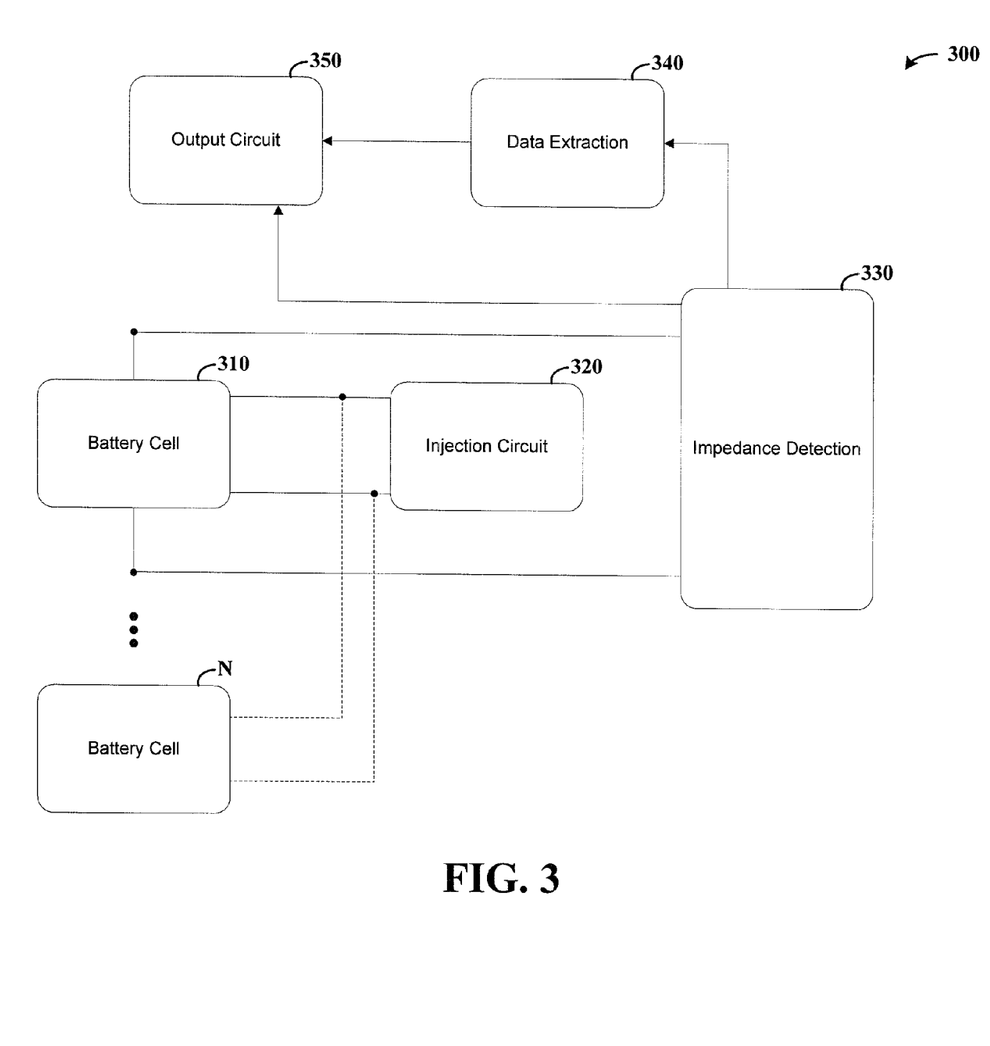
FIG. 3 shows an energy storage cell apparatus, in accordance with another example embodiment.

FIG. 3 shows an energy storage cell apparatus 300, in accordance with another example embodiment. The apparatus 300 includes a plurality of battery cells 310-N, and a current injection circuit 320 that separately injects current into individual ones of the plurality of battery cells. The injection circuit 320 may, for example, be coupled as shown via dashed lines to connect to more than one of cells 310-N (e.g., via a switch). In some embodiments, an injection circuit 320 as shown for battery cell 310 is included for each battery cell 310-N.

An impedance-detection circuit 330 is coupled across cells 310-N (shown coupled across 310 by way of example) to detect a voltage-based impedance characteristic of the battery cells, in response to the injected current therein. The impedance-detection circuit 330 is also coupled to detect current through the cells, such as via a resistor in-line with the cells, and may include separate detection components for current at the resistor (e.g., represented by voltage across the resistor) and voltage at the individual battery cells.

A data extraction circuit 340 is coupled to the impedance-detection circuit and configured to receive impedance data regarding the detected impedance characteristic from the impedance-detection circuit, separate low-frequency components of the impedance data, and extract impedance information for the plurality of battery cells from the high-bandwidth, including high-frequency, components.

An output circuit 350 provides the low-frequency components and the extracted impedance information from the high-bandwidth components, received via the data extraction circuit 340, as an output indicative of impedance characteristics of the energy storage cell apparatus. The low-frequency components can be provided directly from the impedance detection circuit 330, or after processing, at the data extraction circuit 340.

Figure 4:
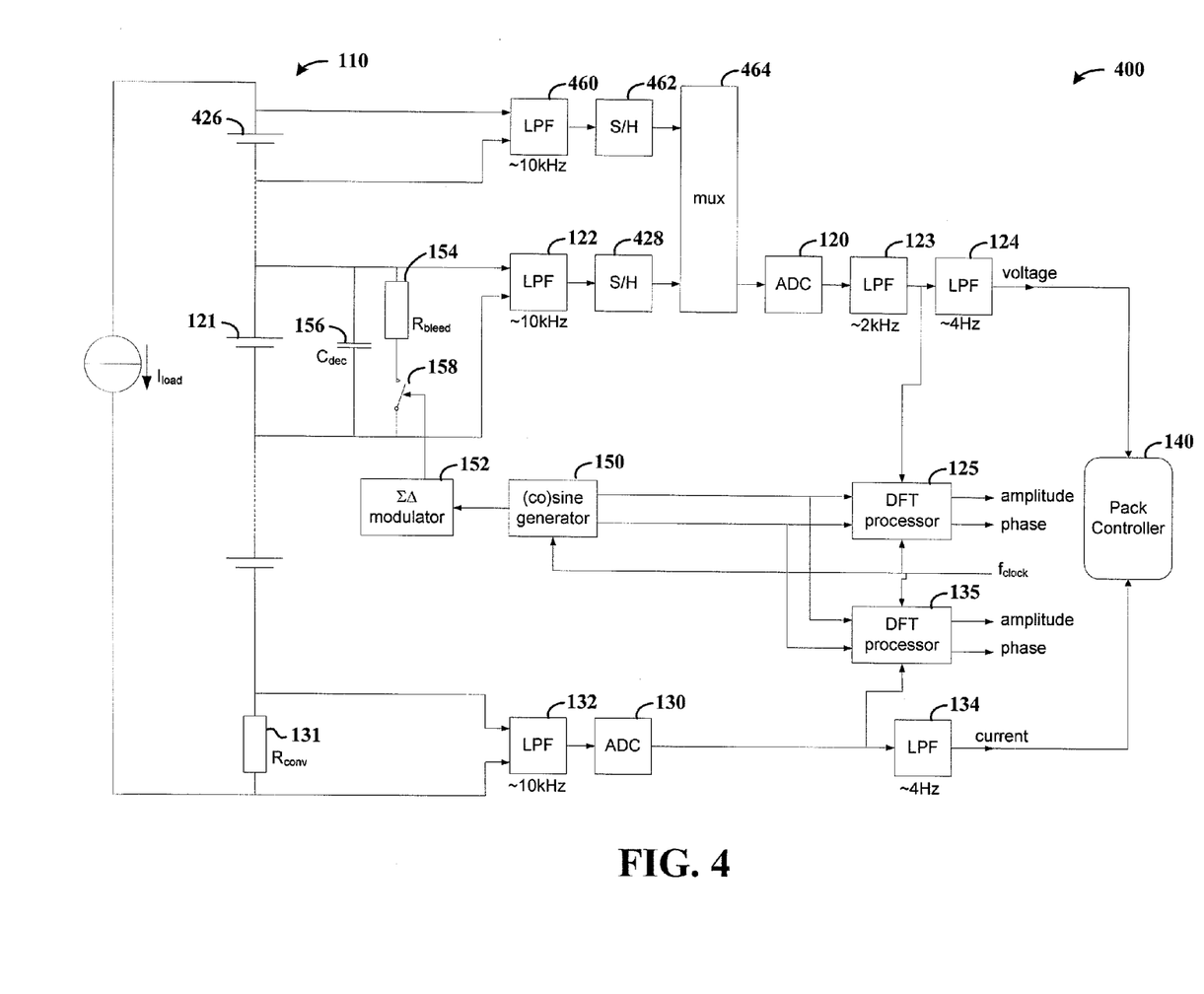
FIG. 4 shows a system for measuring cell characteristics of a battery pack with a multiplexed input for an ADC, in accordance with an example embodiment of the present invention.

FIG. 4 shows a system 400 for measuring cell characteristics of a battery pack with a multiplexed input for an ADC, in accordance with an example embodiment of the present invention. The system 400 includes various components that are similar to those in FIG. 1, with corresponding reference numerals and certain repeated description omitted here for brevity. The system 400 includes a multiplexer 464 that multiplexes inputs from a plurality of battery cells to a single ADC 120, with cells 121 and 426 shown by way of example.

Each additional cell includes a low-pass filter, with filter 460 shown coupled across cell 426. Each additional cell may further include balancing circuits (e.g., as with 154, 156) as shown with cell 121. Depending on the type of ADC 120 used, sample-and-hold (S/H) circuits 428 and 462 may be implemented prior to the multiplexer 464. If a sigma-delta converter is used as the ADC 120, the low-pass filter 123 can be eliminated from the system.

In some implementations, the system 400 is configured to analyze multiple frequencies in one measurement run. In other implementations, the system 400 is configured to evaluate one frequency in each measurement run, and the DFT processor 125 is implemented as a synchronous demodulator.

Impedance measurement, as carried out in connection with one or more embodiments herein (e.g., such as those described in connection with FIGS. 1-4), may be effected in various manners. In some embodiments, impedance measurements are carried out while charging the battery pack (e.g., using predictable, replenishing power from a charging source), or under various driving conditions, such as breaking or coasting with a certain motor-braking torque. The measurement can be performed with a charger that can both charge and discharge with a selectable current, as negative currents can then be measured (e.g., as implemented with what is referred to herein as a current injection circuit, where such current is negative).

In accordance with a particular embodiment, impedance is carried out as follows. An impedance-measurement circuit waits until current, temperature, and SoC are at a level at which a new measurement must be done, such as may be determined by comparing such parameters to stored/table values. The cell(s) to be measured are selected, and spectra of voltage and pack current are measured at a desired frequency or frequencies (e.g., one frequency at a time or multiple frequencies at once). If the pack current does not contain enough signal at the desired frequency/frequencies, current is injected in the selected cell(s), such as by using a PDM-modulated balance current. While injecting current with the balancer, the spectrum of the pack current is measured. If the pack current also contains a signal at the measurement frequency, then the measurement is determined to be unreliable, its result is discarded, and the measurement is repeated. If the measurement is taken while driving, the DC level of the current is checked to ensure that it has stayed at the level at which the measurement should be taken.

In some embodiments in which pack current is no accessible and/or is in a format that cannot be used by the impedance measurement circuitry, an impedance measurement procedure is implemented as follows, with exemplary reference to implementation with the system 400. After current, temperature, and SoC reach a level at which a new measurement is to be made, the cells to be measured are selected, and current is injected in the selected cells using a PDM modulated balance current. While injecting current with the balancer, the spectrum of the selected cells, plus the spectrum of (at least) one cell in which no current is injected are measured. If the pack current contains a signal at the measurement frequency, it is determined that this frequency is also present in the measurement of the cell(s) in which no current is injected, the impedance measurement is determined as unreliable, its result is discarded and the measurement is repeated. For each measurement, another cell is selected to check whether the spectrum is clean at the measurement frequencies. If this measurement is carried out while the battery pack is used for driving a vehicle, the DC level of the current is checked to ensure that it has stayed at the level at which the measurement should be taken (e.g., using an assumption that the temperature is unlikely to change much in the time frame of the measurement). In some implementations, the current detection circuits including 130, 131, 132, 134 and 135 are omitted.

In some embodiments involving an automotive battery used for propulsion, instead of injecting a modulated current into each individual cell, the pack current is modulated by modulating the motor current with a desired frequency. The amplitude of the modulation is controlled to mitigate discomfort to automotive passengers and damage to the motor.

With respect to various cell-balancing circuits as described herein and used for current injection, various embodiments are directed to such circuits implemented as follows. Cell-balancing circuits equalize SoCs between the series-coupled cells by balancing SoCs of the cells during use and/or charging, to prevent or mitigate over-charging or over-discharging. Passive though a resistive circuit. While charging, current may be also selectively routed around a cell having a higher SoC, via the resistive circuit, to avoid further charging of the cell. Passive cell-balancing circuits may also be referred to as dissipative cell-balancing circuits. Active cell-balancing circuits transfer energy from a cell having a higher SoC to a cell having a lower SoC. The transfer of energy between cells may be performed indirectly through an energy storage component such as a capacitor or an inductor. Active cell-balancing circuits may also be referred to as non-dissipative cell-balancing circuits.

Based upon the above discussion and illustrations, those skilled in the art will readily recognize that various modifications and changes may be made to the present invention without strictly following the exemplary embodiments and applications illustrated and described herein. For example, passive or active circuits can be used for injecting current, and negative or positive current may be injected. Other types of signal generators and various types of signals may be used for current injection. In addition, current-based impedance detection may be omitted when characteristics of current passing through the battery cells is known (e.g., the upper detection (ADC) and extraction (filter, DFT) circuits in FIG. 1 may be used separately from the lower detection and extraction circuits). Other variations as discussed in connection with certain embodiments and/or shown in the figures, may also be implemented with other embodiments. Such modifications do not depart from the true spirit and scope of the present invention, including that set forth in the following claims.

What is claimed is:

1. An energy storage cell apparatus, comprising:
a plurality of battery cells;
a current injection circuit configured to separately inject current into individual ones of the plurality of battery cells;
an impedance-detection circuit coupled to detect an impedance characteristic of the plurality of battery cells responsive to the injected current therein;
a data extraction circuit coupled to the impedance-detection circuit and configured to:
receive high-bandwidth impedance data regarding the detected impedance characteristic from the impedance-detection circuit,
separate low-frequency components of the impedance data from higher-frequency components of the impedance data, and
extract impedance information for the plurality of battery cells from the high-bandwidth impedance data; and
an output circuit configured to provide the low-frequency components and the extracted impedance information as an output indicative of impedance characteristics of the energy storage cell apparatus.

2. The apparatus of claim 1, wherein the current injection circuit is configured to separately inject current into individual ones of the plurality of battery cells by coupling a cell balancing circuit across a single one of the plurality of battery cells to inject current therein, the cell balancing circuit being coupled to pass current between the single one of the battery cells and at least another battery cell.

3. The apparatus of claim 1, wherein the current injection circuit is configured to separately inject current into individual ones of the plurality of battery cells by:
selecting a subset of the battery cells to evaluate based upon a state of charge characteristic of the subset, and
for each battery cell in the subset, separately coupling a cell balancing circuit across the battery cell to inject current in the battery cell, separately from current injected into other battery cells in the subset, the cell balancing circuit being coupled to pass current between the individual battery cell and at least another one of the plurality of battery cells.

4. The apparatus of claim 1, wherein the data extraction circuit includes:
a filter configured to separate the low-frequency components of the impedance data; and
a discrete Fourier transform circuit configured to extract the impedance information from the high-bandwidth components.

5. The apparatus of claim 1, wherein the impedance-detection circuit includes a voltage detection circuit configured to, for each battery cell, detect the voltage across the battery cell, and a current detection circuit configured to detect current through the battery cells, and
the data extraction circuit is integrated on a common circuit with the impedance-detection circuit and includes a voltage transform circuit configured to extract voltage amplitude and phase information from the high-bandwidth components of an output of the voltage detection circuit, and a current transform circuit configured to extract current amplitude and phase information from the high-bandwidth components of an output of the current detection circuit.

6. The apparatus of claim 1, wherein the current injection circuit is configured to separately inject current into individual ones of the plurality of battery cells by, for each battery cell, operating a switch using a modulated signal to selectively couple and decouple a balancing circuit to the battery cell to inject current in the battery cell at a duty cycle that is limited to limit an amount of current injected into the battery cell, and
the impedance-detection circuit is configured to detect an impedance characteristic of each battery cell based upon the modulated signal.

7. The apparatus of claim 1, wherein the current injection circuit includes:
a balance circuit configured to balance charge between different ones of the battery cells; and
a modulator configured to, for each of the battery cells, operate a switch between open and closed positions to cyclically couple the balancing circuit to the battery cell at a frequency that effects an injection of a predefined current into the battery cell for impedance measurement.

8. The apparatus of claim 1, wherein the current injection circuit is configured to separately inject current into individual ones of the plurality of battery cells by, for each battery cell, closing a switch coupling at least one of:
a resistor circuit across the battery cell to passively bleed current from the battery cell; and
an inductor circuit across the battery cell to actively induce current via the battery cell.

9. The apparatus of claim 1, wherein the current injection circuit includes a switched sigma-delta modulator and cosine generator configured to, for each of the plurality of battery cells, switch a balancer circuit between on and off states to separately inject current into the battery cell, relative to another one of the battery cells.

10. The apparatus of claim 1, wherein the output circuit is configured to provide the low-frequency components to a battery pack controller that controls the balancing of charge between the plurality of battery cells.

11. The apparatus of claim 1, wherein the current injection circuit is configured to separately inject current into individual ones of the plurality of battery cells by, for each battery cell, controlling a balancing circuit to inject current at a predefined frequency and amplitude to facilitate the detection of an impedance characteristic by the impedance-detection circuit.

12. The apparatus of claim 1, further including:
a balancing circuit configured to balance charge between the battery cells; and
a battery pack controller configured to
control the balancing circuit based upon the low-frequency components, and
use the extracted impedance information and the low-frequency components to determine an impedance-based condition of the energy storage cell apparatus.

13. A monitoring circuit for monitoring a battery pack having a plurality of battery cells connected in series, the monitoring circuit comprising:
a current injection circuit configured to separately inject current into individual ones of the plurality of battery cells;
a voltage detection circuit configured to provide, for each of the battery cells, an output indicative of cell voltage of the battery cell responsive to the injected current;

a current detection circuit configured to provide an output indicative of current through a circuit connected in series with the battery cells and therein indicate current through the battery cells;

an extraction circuit configured to extract amplitude and phase characteristics of the outputs of the current and voltage detection circuits, to provide an indication of an impedance characteristic of the cells responsive to the injected current;

first and second low-frequency filter circuits respectively configured to separate low-frequency components of the output of the voltage and current detection circuits from higher-frequency components of the output of the voltage and current detection circuits, the low-frequency components indicative of a state of charge (SoC) for the battery cells and a low-frequency part of an impedance curve for a battery cell; and a battery pack controller coupled to receive the low-frequency components from the first and second low-frequency filter circuits and configured to use the low-frequency components to estimate the SoC for the battery cells.

14. The circuit of claim 13, wherein the current injection circuit includes:

a wave generator configured to generate a signal having a frequency at which current is to be selectively injected into the battery cell for impedance detection; and a sigma-delta modulator coupled to receive the generated signal and, in response thereto, operate a switch to couple the balancing circuit to the battery cell for intermittently injecting current therein, and wherein the extraction circuit includes at least one discrete Fourier transform circuit configured to generate said amplitude and phase characteristics.

15. The circuit of claim 13, wherein the current injection circuit is configured to separately inject current into individual ones of the plurality of battery cells by injecting current at a measurement frequency, the current detection circuit is configured to provide an output indicative of current through a circuit connected in series with the battery cells by providing a pack current output indicative of cell voltage of one of the battery cells in which no current is injected, and the data extraction circuit is configured to, in response to the pack current output being indicative of a pack current at the measurement frequency present in the one of the battery cells in which no current is injected, detecting the measurement in another one of the battery cells as being unreliable.

16. A method for monitoring a battery pack having a plurality of battery cells connected in series, the method comprising, in a battery pack circuit:

separately injecting current into individual ones of the plurality of battery cells;

providing, by a voltage detection circuit, for each of the battery cells, an output indicative of cell voltage of the battery cell responsive to the current injected into the battery cell;

providing, by a current detection circuit, an output indicative of current through each of the battery cells;

extracting amplitude and phase characteristics of the current and voltage outputs for each of the cells, to provide an indication of an impedance characteristic of the cells;

separating low-frequency components of the output of the voltage and current detection circuits from higher-frequency components of the voltage and current detection circuits, the low-frequency components indicative of a state of charge (SoC) for the battery cells and a low-frequency part of an impedance curve for a battery cell; and receiving the low-frequency components from filter circuits and using the low-frequency components to estimate the SoC for the battery cells.

17. The method of claim 16, wherein separately injecting current into individual ones of the plurality of battery cells includes:

cyclically coupling a balancing circuit to the battery cell to inject current therein; and extracting amplitude and phase characteristics include operating discrete Fourier transform components integrated in the battery pack circuit to respectively determine amplitude and phase characteristics for the outputs indicative of voltage of the battery cell and current through the battery cells, to provide an indication of the impedance of each of the battery cells.

18. The method of claim 16, wherein separately injecting current into individual ones of the plurality of battery cells includes:

determining a subset of the battery cells to be monitored based upon a condition of the battery cell reaching a threshold;

measuring a spectra of voltage and pack current at a selected frequency; and in response to the pack current providing an insufficient signal at the selected frequency, injecting current into at least one of the subset of battery cells.

19. The method of claim 18, further including, in response to the pack current providing the insufficient signal at the selected frequency:

discarding the extracted amplitude and phase characteristics and repeating the steps of injecting current, providing an output indicative of current and extracting amplitude and phase characteristics.

* * * * *